United States Patent
Tsyrganovich (10) Patent No.: US 7,068,197 B1
(45) Date of Patent: *Jun. 27, 2006

(54) ADC WITH REDUCED QUANTIZATION NOISE AND PROGRAMMABLE BIT RESOLUTION

(75) Inventor: Anatoliy V. Tsyrganovich, San Jose, CA (US)

(73) Assignee: ZiLOG, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/821,517

(22) Filed: Apr. 9, 2004

Related U.S. Application Data (63) Continuation-in-part of application No. 10/331,037, filed on Dec. 27, 2002, now Pat. No. 6,839,010.

(51) Int. Cl.
*H03M 3/00* (2006.01)

(52) U.S. Cl. ..................................... 341/143; 341/155
(58) Field of Classification Search ......... 341/118–172
See application file for complete search history.

(56) References Cited

U.S. PATENT DOCUMENTS

| | | | | |
|---|---|---|---|---|
| 4,851,841 A | | 7/1989 | Sooch | 341/143 |
| 5,157,395 A | * | 10/1992 | Del Signore et al. | 341/143 |
| 5,181,033 A | * | 1/1993 | Yassa et al. | 341/143 |
| 5,724,037 A | * | 3/1998 | Lee | 341/143 |
| 5,781,138 A | * | 7/1998 | Knudsen | 341/143 |
| 6,009,445 A | | 12/1999 | Tsyrganovich | 708/300 |
| 6,147,633 A | * | 11/2000 | Ukawa et al. | 341/143 |
| 6,218,973 B1 | * | 4/2001 | Barrett et al. | 341/143 |
| 6,249,237 B1 | * | 6/2001 | Prater | 341/143 |
| 6,252,531 B1 | * | 6/2001 | Gordon et al. | 341/143 |
| 6,304,608 B1 | * | 10/2001 | Chen et al. | 341/143 |
| 6,346,898 B1 | * | 2/2002 | Melanson | 341/143 |
| 6,587,062 B1 | * | 7/2003 | Reinhold et al. | 341/143 |
| 6,639,526 B1 | * | 10/2003 | Mayes | 341/143 |
| 6,839,010 B1 | * | 1/2005 | Tsyrganovich | 341/143 |

* cited by examiner

*Primary Examiner*—Lam T. Mai
(74) *Attorney, Agent, or Firm*—Silicon Edge Law Group LLP; Darien K. Wallace; T. Lester Wallace (57) ABSTRACT

An improved sigma-delta converter includes a post converter filter portion that receives digital data streams. The post converter filter portion is programmable to receive digital data streams of varying bit widths. The data streams have digital amplitudes and contain quantization noise. Quantization noise is larger for digital amplitudes in a second larger-amplitude range than in a first smaller-amplitude range. The post converter filter has a higher cut-off frequency when the digital amplitude is in the first amplitude range and a lower cut-off frequency when the digital amplitude is in the second amplitude range. The post converter filter therefore filters out a portion of the larger quantization noise when the digital amplitude is larger. Quanitization noise is reduced without limiting the input signal voltage range that can be digitized.

23 Claims, 8 Drawing Sheets

NONLINEAR CONTROL BLOCK

SIGNAL ANALYSIS DEVICE

FIG. 10

FILTER CONTROL DEVICE

FIG. 11

VARIABLE LOW-PASS FILTER

ADC WITH REDUCED QUANTIZATION NOISE AND PROGRAMMABLE BIT RESOLUTION

CROSS REFERENCE TO RELATED APPLICATION

This application is a continuation in part of, and claims priority under 35 U.S.C. §120 from, nonprovisional U.S. patent application Ser. No. 10/331,037 entitled "Sigma-Delta Analog-to-Digital Converter With Reduced Quantization Noise," filed on Dec. 27, 2002 is now a U.S. Pat. No. 6,839,010, the subject matter of which is incorporated herein by reference.

TECHNICAL FIELD

The present invention relates to analog-to-digital converters, and more specifically to using a variable low-pass filter to reduce noise in an analog-to-digital converter.

BACKGROUND

Figure 1:
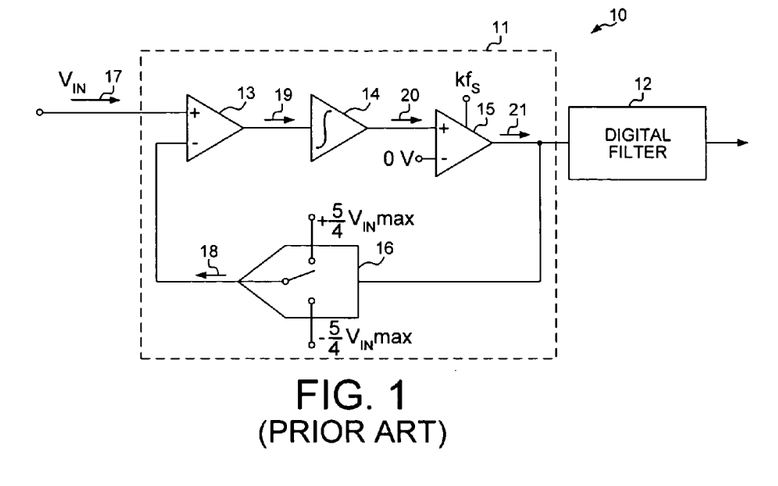
FIG. 1 (prior art) is a simplified schematic block diagram of a sigma-delta converter of the prior art.

FIG. 1 (prior art) is a simplified schematic block diagram of a conventional sigma-delta converter (SD converter) 10. SD converter 10 includes a sigma-delta modulator (SD modulator) portion 11 and a digital filter 12. SD modulator portion 11 is a first-order modulator and includes a summing amplifier 13, an integrator 14, a clocked comparator 15, and a switching device 16.

SD modulator portion 11 operates in cycles as determined by a clock signal of frequency $kf_S$ that clocks comparator 15. Summing amplifier 13 outputs an error signal 19 that represents the difference between an analog input signal 17 and a feedback signal 18. Error signal 19 represents the change in voltage of input signal 17 since the previous cycle of SD modulator portion 11. Integrator 14 performs a time domain integration of error signal 19, yielding an integrated analog output signal 20. Clocked comparator 15 compares analog output signal 20 to a fixed voltage (here, zero volts) on its inverting input lead, thereby converting analog output signal 20 into a one-bit data stream 21 having a bit rate equal to the clock rate. This one-bit data stream 21 is supplied to switching device 16. When the value of digital data stream 21 is a digital one, then switching device 16 outputs +5/4 $V_{IN}$max volts. When the value of digital data stream 21 is a digital zero, then switching device 16 outputs −5/4 $V_{IN}$max volts. Feedback signal 18 comprising a stream of +5/4 $V_{IN}$max and −5/4 $V_{IN}$max values is then fed back to the inverting input lead of summing amplifier 13. The resulting feedback loop of the circuit operates such that a running average of consecutive values of data stream 21 equals the voltage of input signal 17.

SD modulator portion 11 receives an analog input signal 17 whereas it outputs digital data values, each having a limited number of bits. Thus, some information is lost in the analog-to-digital conversion. Random "quantization noise" is therefore said to be introduced. By oversampling analog input signal 17 at a clock frequency $kf_S$ that is much higher than the frequency bandwidth of input signal 17, the quantization noise is spread over a wide frequency range. The magnitude of the quantization noise in the frequency band of interest is therefore decreased.

Integrator 14 operates further to reduce the magnitude of quantization noise in the frequency band of interest. Integrator 14 acts as a low-pass filter to the input signal 17 and as a high-pass filter to the quantization noise. The quantization noise is therefore "shaped" by integrator 14 and is pushed into higher frequencies.

The digital data stream 21 as output by SD modulator portion 11 is then filtered by digital filter 12. Filtering reduces the data rate of digital data stream 21. Filtering also removes most of the quantization noise that has been shaped into higher frequencies.

The SD converter 10 of FIG. 1 outputs a data stream of one-bit values. This example provides a simple description of the operation of a SD converter. There are, however, other SD converters that output data streams of multi-bit values.

Figure 2:
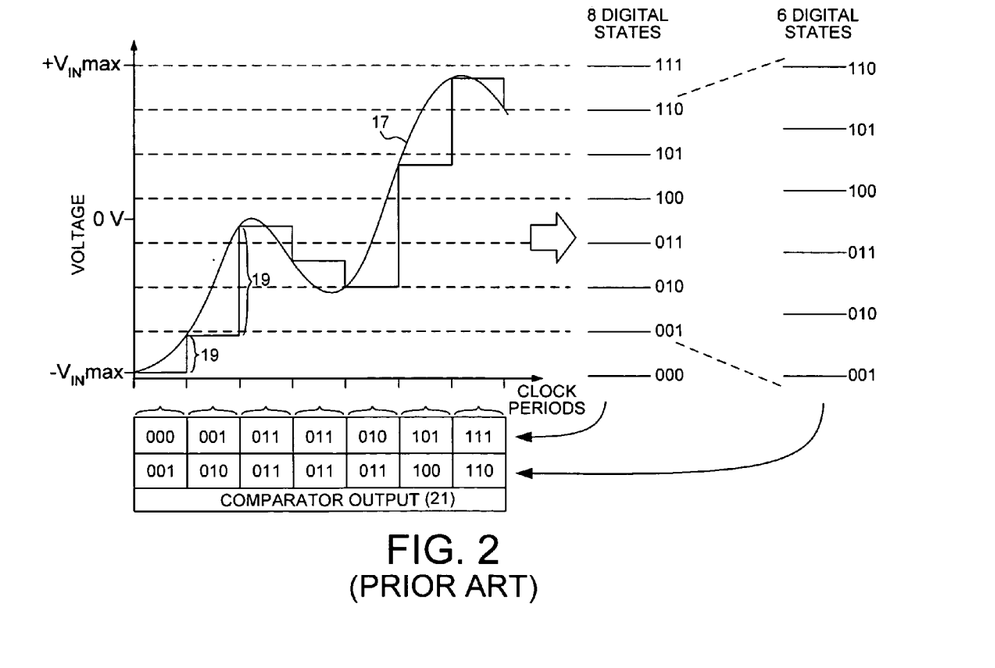
FIG. 2 (prior art) is a graph illustrating a voltage scaling method of the prior art.

FIG. 2 (prior art) is a graph illustrative of the output of such an SD converter that outputs a stream of three-bit values. The largest three-bit value is "111" as indicated by the top three-bit value in the column labeled "8 digital states". The smallest three-bit value is "000" as indicated by the bottom value in the column labeled "8 digital states". The stream of three-bit values that corresponds to analog input signal 17 is shown in the top row of the table below the graph.

In addition to the above-described random quantization noise introduced by interpreting a continuous analog input as a discrete digital state, non-random quantization noise is also created. This non-random noise is generated when the SD modulator portion is outputting values near the digital states that are represented by all ones (for example, "111") and all zeros (for example, "000"). Random noise results when a given analog input value is sometimes interpreted as a higher digital state and sometimes as a lower digital state. Near the digital state of all ones, however, noise cannot result in a digital state that is higher than the state with all ones. Similarly, near the digital state of all zeros, noise cannot result in a digital state that is lower than all zeros. Quantization noise near these two limits of the available digital states is not partially above and partially below the correct state and is, therefore, not random. The non-random quantization noise is not shaped into higher frequencies to the extent that random quantization noise is shaped.

One conventional method for overcoming the non-random quantization noise that occurs near the limits of the available digital states involves voltage scaling. The positive voltage value and the negative voltage value of feedback signal 18 are scaled, for example, by a factor of five fourths, so that the amplitude of error signal 19 is four fifths of its non-scaled value. Because the voltage of the feedback signal 18 can exceed the maximum voltage input voltage of input signal 17, non-random quantization noise that occurs near the limits of the available digital states can be reduced. The amplitude of analog output signal 20 is thereby reduced by four fifths, and the correct digital state of the maximum amplitude of input signal 17 is made to be a digital state less than all ones. Likewise, the correct digital state of the minimum amplitude of input signal 17 is made to be a digital state greater than all zeros.

In FIG. 2, the rightmost column labeled "6 digital states" shows the number of digital states reduced to six after scaling. After scaling, the maximum and minimum amplitudes of input signal 17 correspond to digital states 110 and 001, respectively, instead of to 111 and 000. The lower row of the table below the graph of FIG. 2 shows a series of 3-bit values of such a data stream 21 proceeding from left to right. For a description of a similar method of conventional scaling, see U.S. Pat. No. 4,851,841.

Accordingly, the prior art scaling technique reduces non-random quantization noise by scaling up feedback signal amplitudes so that maximum and minimum input signal voltages are represented digitally by states that are not the maximum and minimum available digital states. Because quantization noise is increased by decreasing the number of digital states, this scaling technique increases random quantization noise. Moreover, scaling up the amplitude of feedback signal 18 increases power consumption.

An apparatus and a method are sought that decrease quantization noise in the frequency band of interest while using all available digital states.

SUMMARY

A sigma-delta converter includes a sigma-delta converter portion and a post converter filter portion. The post converter filter portion receives a digital data stream from the sigma-delta converter portion. The digital data stream comprises a signal of interest having a digital amplitude and contains quantization noise. The quantization noise is larger when the digital amplitude is in a second range of larger amplitude than when the digital amplitude is in a first range of smaller amplitude. In accordance with one embodiment, the post converter filter portion has a first cut-off frequency when the digital amplitude is in the first amplitude range and a second cut-off frequency when the digital amplitude is in the second amplitude range. Where the sigma-delta converter portion includes a digital low-pass filter with a fixed cut-off frequency, the first cut-off frequency of the post converter filter portion is higher than the fixed cut-off frequency, whereas the second cut-off frequency of the post converter filter portion is lower than the fixed cut-off frequency. Accordingly, when the digital amplitude is in the first amplitude range corresponding to a smaller quantization noise, the post converter filter portion has a higher cutoff-frequency than the digital low-pass filter and therefore has minimal effect. When the digital amplitude is in the second amplitude range corresponding to a larger quantization noise, on the other hand, the post converter filter portion has a lower cutoff-frequency than the digital low-pass filter and therefore filters out a portion of the larger quantization noise. This filtering out of quanitization noise is accomplished without having to reduce the number of digital states used to represent the magnitude of the input signal. In one embodiment, power consumption of the sigma-delta converter is minimized by not scaling up the voltage amplitude of a feedback signal.

In another embodiment, the variable low-pass filter is switched off when the amplitude of the digital data stream is in the first amplitude range corresponding to smaller quantization noise.

In accordance with a specific embodiment, a signal analysis device of the post converter filter portion detects the digital amplitude of the digital data stream and outputs a filter control value based on the detected value. This filter control value, which is supplied to a variable low-pass filter of the post converter filter portion, controls the variable low-pass filter to have the appropriate one of the first and second cut-off frequencies. The first cut-off frequency can be higher than the fixed cut-off frequency of the digital low-pass filter, such that the post converter filter portion does not have a significant impact on the resulting output of the analog-to-digital converter. The second cut-off frequency, however, is lower than the fixed cut-off frequency of the digital low-pass filter, such that the post converter filter portion operates to remove significant quantization noise from the output of the sigma-delta converter portion.

In situations where a sigma-delta converter is battery powered and $V_{IN}$max is the battery voltage, the maximum input signal amplitude that can be digitized using the conventional voltage scaling technique is smaller than $V_{IN}$max by a scaling factor. In accordance with one embodiment of the present invention, on the other hand, the maximum input signal amplitude that can be digitized is approximately $V_{IN}$max. In a case where the sigma-delta converter is battery powered, input signals of amplitude up to the battery voltage can be digitized.

In yet another embodiment, the bit resolution of a sigma-delta converter with reduced quantization noise is programmable. A user can program this embodiment to operate at multiple bit widths. Depending on the desired bit resolution, reference values of the signal analysis device are programmed to correspond to various ranges of digital amplitudes of the digital data stream output by the sigma-delta converter portion. The various ranges of amplitude correspond to the various cut-off frequencies of the variable low-pass filter. The cut-off frequency of the variable low-pass filter is lowered in ranges of higher digital amplitude. The sigma-delta converter with reduced quantization noise also programs the signal analysis device with an additional set of reference values during periods when the digital data stream output by the sigma-delta converter portion exhibits high noise. The additional set of reference values expands the ranges of digital amplitudes wherein the various cut-off frequencies of the variable low-pass filter are lowered.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 3:
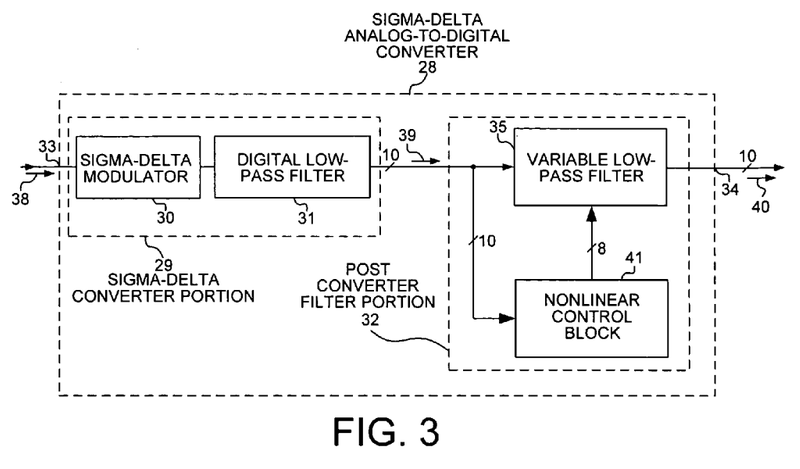
FIG. 3 is a simplified schematic block diagram of an improved sigma-delta converter with a variable low-pass filter.

FIG. 3 is a simplified schematic block diagram of a sigma-delta analog-to-digital converter (SDADC) 28 in accordance with one embodiment of the present invention. SDADC 28 includes a sigma-delta converter portion 29 and a post converter filter portion 32. Sigma-delta converter portion 29 includes a sigma-delta modulator (SD modulator) 30 and a digital low-pass filter 31. SDADC 28 has an input lead 33 and a ten-bit output bus 34. Post converter filter portion 32 includes a variable low-pass filter 35 and a nonlinear control block 41.

SDADC 28 receives a continuous analog input signal 38 on input lead 33. SDADC 28 outputs a stream of ten-bit digital output values 40 onto ten-bit output bus 34. In this embodiment, SD modulator 30 and digital low-pass filter 31 convert analog input signal 38 to a ten-bit intermediary digital data stream 39. Intermediary digital data stream 39 uses all of the 1024 ($2^{10}$) digital states available for the ten-bit output of digital low-pass filter 31.

SD modulator 30 introduces random quantization noise into intermediary digital data stream 39 as SD modulator 30 digitizes continuous analog input signal 38 into the available 1024 digital states. The amount of random quantization noise expressed as power depends on the step size of the digital states used for digitization.

SD modulator 30 oversamples analog input signal 38 at a sampling frequency $kf_S$ (where k is the oversampling ratio) that is at least twice as great as the frequency of analog input signal 38 in order to avoid aliasing according to the Nyquist theory. Oversampling spreads the quantization noise power over a wide frequency range that is proportional to k. The power level of the random quantization noise is thereby decreased at each frequency of intermediary data stream 39, including at the frequency band of input signal 38. SD modulator 30 also shapes the random quantization noise into higher frequencies and decreases the magnitude of quantization noise at the frequency band of input signal 38.

SD modulator 30 also creates non-random quantization noise during digitization when the voltage amplitude of analog input signal 38 is converted to a high digital amplitude represented by a digital state of all ones (for example, "1111111111"). In addition, non-random quantization noise is also created during digitization when the voltage amplitude of input signal 38 is converted to a low digital amplitude represented by a digital state of all zeros (for example, "0000000000"). Near the digital amplitudes of all ones and all zeros, quantization noise is not represented over time as being both above and below the correct digital amplitude because digital states higher than all ones and lower than all zeros are not available. Thus, quantization noise near the limits of the available digital states is not random and is not shaped into higher frequencies by SD modulator 30 to the same extent as random noise is shaped.

Figure 4:
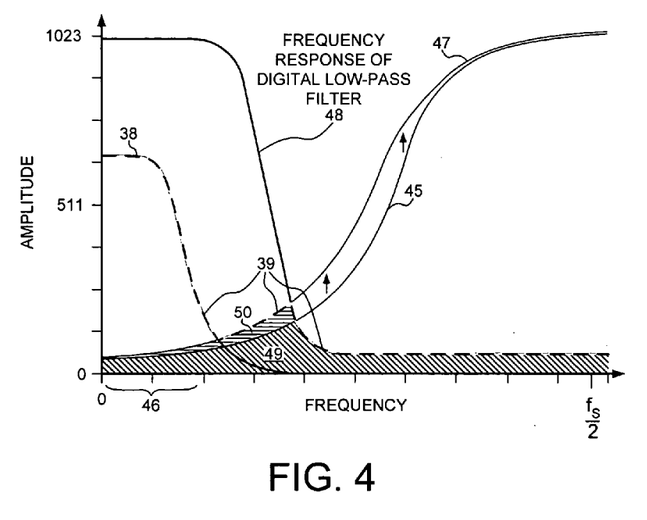
FIG. 4 is a graph of a frequency response curve of the sigma-delta converter portion of the improved sigma-delta converter.

FIG. 4 shows how SD modulator 30 shapes the random quantization noise towards higher frequencies. Frequency response curve 48 represents the response curve of digital low-pass filter 31. In this embodiment, frequency response curve 48 is a fixed frequency response curve. Digital low-pass filter 31 filters out both random and non-random quantization noise that exist above first frequency response curve 48. The resulting filtered ten-bit intermediary digital data stream 39 is supplied to variable low-pass filter 35, as well as to nonlinear control block 41.

The dashed line in FIG. 4 illustrates the frequency domain waveform of intermediary digital data stream 39. The scale of the amplitude of noise and of data stream 39 is shown as the 1024 digital states (zero through 1023) of ten-bit resolution into which the voltage of data stream 39 and noise has been quantized. The area below curve 45 represents random quantization noise that has been shaped into frequencies higher than the frequency band 46 of analog input signal 38. Curve 45 has a region of increasing slope at lower frequencies and a region of decreasing slope at higher frequencies. Curve 45 corresponds to the shaping achieved by SD modulator 30, which is a higher-order SD modulator with multiple feedback loops and integrators. In another embodiment having a first-order sigma-delta modulator with a single feedback loop and a single integrator, the curve representing shaped quantization noise may have only a region of decreasing slope.

In FIG. 4, the area between curve 47 and curve 45 represents the non-random quantization noise created by SD modulator 30. This non-random quantization noise is shaped to a much lesser extent into higher frequencies than is random quantization noise and contributes a substantial additional amount of noise at all frequencies.

First frequency response curve 48 represents a frequency domain transfer function of digital low-pass filter 31. Digital low-pass filter 31 therefore filters out both random and non-random quantization noise that exist above first frequency response curve 48. As shown in FIG. 4, an amount 49 of random quantization noise and an amount 50 of non-random quantization noise pass through digital low-pass filter 31.

The amount 50 of non-random quantization noise does not pass through the digital filter 12 of the prior art described in the background section because that prior art reduces non-random quantization noise through voltage scaling. In this embodiment of the present invention, however, post converter filter portion 32 filters out a portion of the amount 50 of non-random quantization noise.

Figure 5:
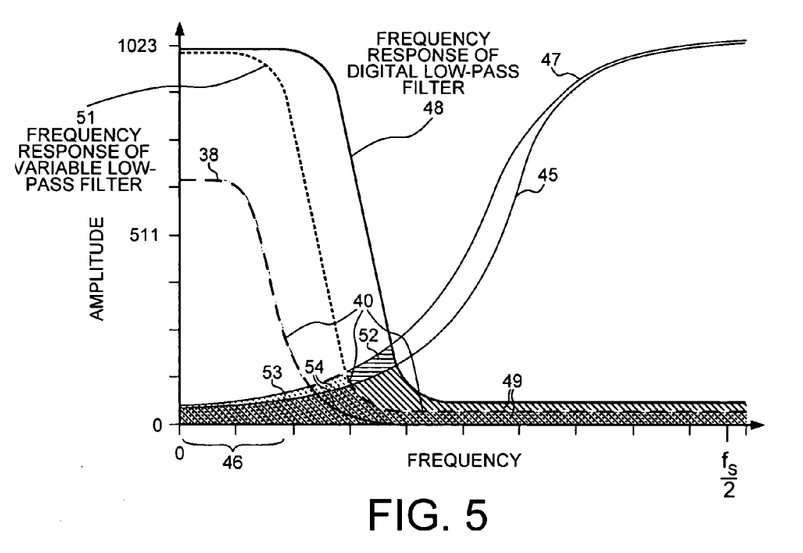
FIG. 5 is a graph showing a frequency response curve of the post converter filter portion of the improved sigma-delta converter.

FIG. 5 illustrates how a portion of amount 50 of non-random quantization noise is filtered out in this embodiment. Variable low-pass filter 35 can have any one of a plurality of frequency domain transfer functions as determined by an eight-bit filter control value supplied to it by nonlinear control block 41. In FIG. 5, second frequency response curve 51 represents the multiple transfer functions of variable low-pass filter 35 for multiple filter control values. By varying the filter control value supplied to variable low-pass filter 35, second frequency response curve 51 can be set to have a cut-off frequency either higher or lower than the cut-off frequency $f_C48$ of first frequency response curve 48. When the cut-off frequency of second frequency response curve 51 is lower than the cut-off frequency $f_C48$ of first frequency response curve 48, variable low-pass filter 35 filters out a portion 52 (see FIG. 5) of the amount 50 (see FIG. 4) of non-random quantization noise. As shown in FIG. 5, a portion 53 of the amount 50 of non-random quantization noise passes through variable low-pass filter 35. The sum of random and non-random quantization noise that passes through variable low-pass filter 35 is shown in FIG. 5 as dashed-shaded area 54. The frequency domain waveform of the digital output 40 of SDADC 28 is shown as a dashed line.

Figure 6:
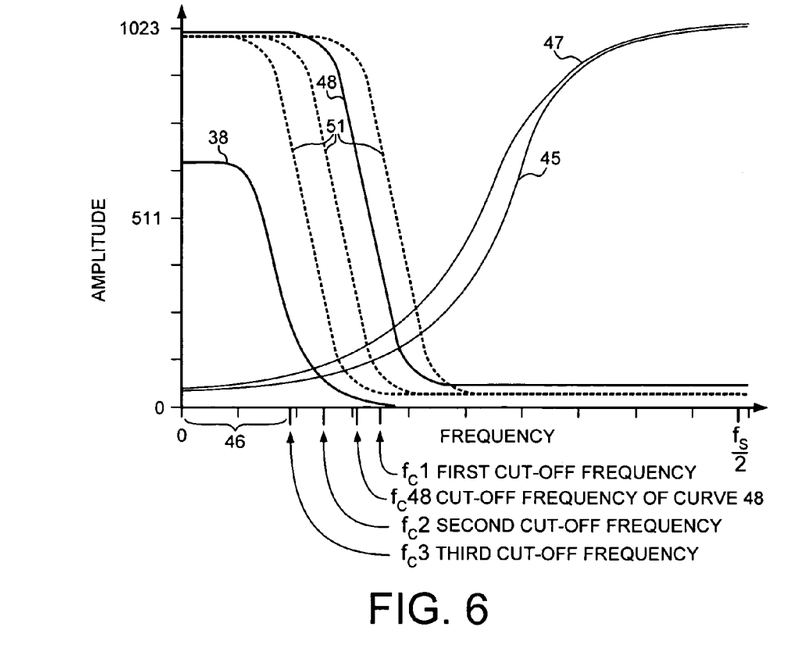
FIG. 6 is a graph of the frequency response curve of FIG. 5 showing three variable cut-off frequencies.

FIG. 6 shows three frequency domain transfer functions of second frequency response curve 51. A first frequency domain transfer function has a first cut-off frequency $f_C1$ that is higher than the cut-off frequency $f_C48$ of first frequency response curve 48. A second frequency domain transfer function has a second cut-off frequency $f_C2$ that is lower than the cut-off frequency $f_C48$ of first frequency response curve 48. A third frequency domain transfer function has a third cut-off frequency $f_C3$ that is lower than second cut-off frequency $f_C2$, but higher than frequency band 46 of analog input signal 38.

Figure 7:
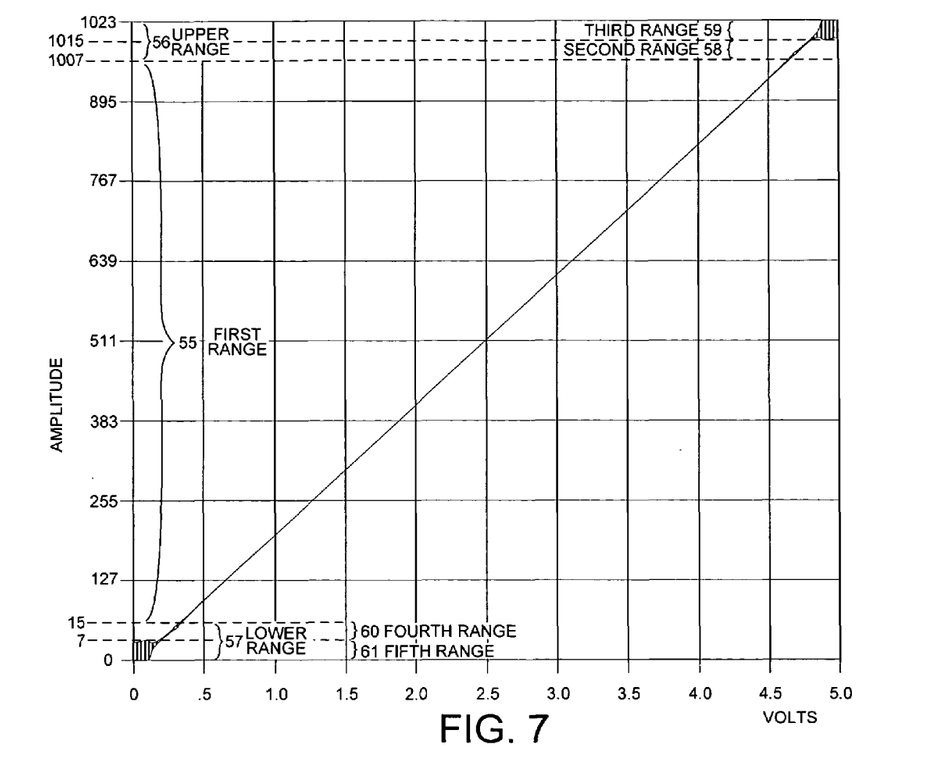
FIG. 7 is a graph of analog input voltage versus digital amplitude of a converted digital data stream.

FIG. 7 is a graph showing the correlation between voltage amplitudes of analog input signal 38 on the horizontal axis and the corresponding digital amplitude of the filtered and decimated ten-bit intermediary digital data stream 39 on the vertical axis. As shown on the horizontal axis, SDADC 28 digitizes input signal 38 having an amplitude ranging from zero volts to five volts. SD modulator 30 and digital low-pass filter 31 convert analog input signal 38 to digital data stream 39 with little noise when the converted digital amplitude is in a first range 55 of medium amplitude.

In an upper range 56 of high amplitude, however, where voltage amplitudes of input signal 38 are digitized into digital amplitudes near the digital state of all ones (for example, "1111111111"), SD modulator 30 creates non-random quantization noise. FIG. 7 shows the noise envelope of numerous digital amplitudes in upper range 56 between the digital values 1007 and 1023 into which discrete analog voltages are potentially digitized. There is likewise a noise envelope of numerous digital amplitudes in a lower range 57 of low amplitude between the digital values zero and fifteen into which discrete analog voltages are potentially digitized. FIG. 7 illustrates that the saturation of digital states near all ones ("1111111111" representing 1023) and near all zeros ("0000000000") results in non-random quantization noise that is not satisfactorily shaped into higher frequencies and filtered out by digital low-pass filter 31.

Figure 8:
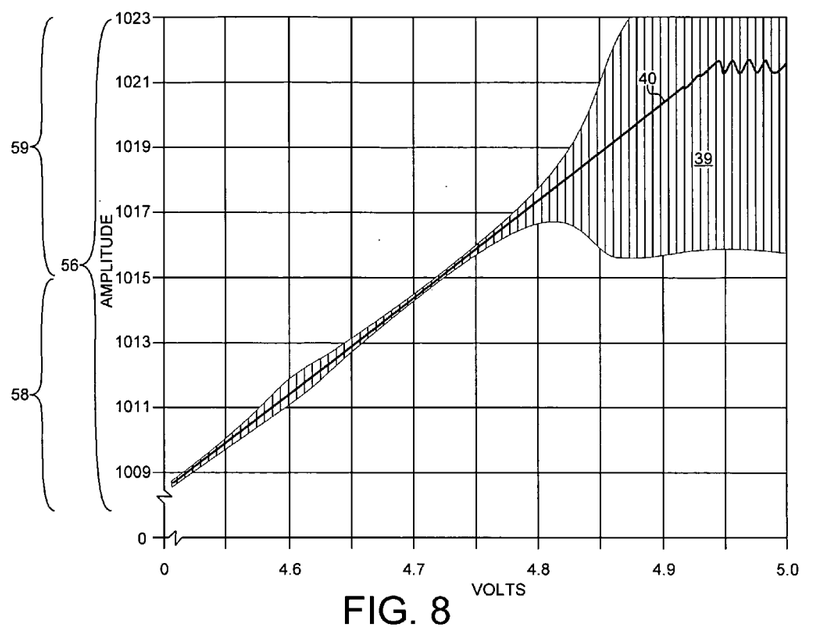
FIG. 8 is a larger scale graph of input voltage versus digital amplitude of a portion of the graph of FIG. 7.

FIG. 8 shows the high-amplitude upper range 56 of FIG. 7 in more detail. Upper range 56 of high digital amplitude itself is composed of a second range 58 and a third range 59. Non-random quantization noise from saturation of digital states is more pronounced in third range 59 between digital values of 1015 and 1023 than in second range 58 between digital values of 1007 and 1015. A voltage amplitude of analog input signal 38 equaling 4.85 volts, for example, is potentially converted to numerous digital amplitudes of digital data stream 39 equaling anywhere between 1016 and 1021.

FIG. 8 also shows the correlation between voltage amplitudes of analog input signal 38 and the corresponding digital amplitude of digital output 40 of SDADC 28 in accordance with an embodiment of the present invention. The non-random quantization noise associated with the saturation of digital states is substantially removed from digital output 40. The additional attenuation of non-random quantization noise is accomplished by post converter filter portion 32. Post converter filter portion 32 filters out the additional portion 52 (shown in FIG. 4) of non-random quantization noise by reducing the cut-off frequency of second frequency response curve 51 from pre-set first cut-off frequency $f_C1$ to second cut-off frequency $f_C2$ when the digital amplitude of digital output 40 enters upper range 56 of high digital amplitude and lower range 57 of low digital amplitude.

Figure 9:
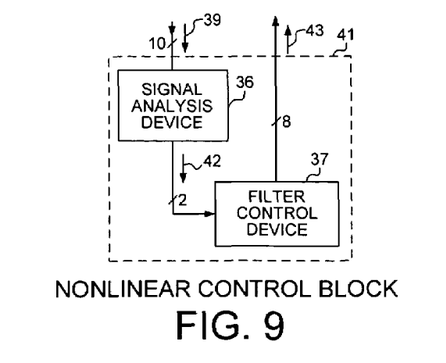
FIG. 9 is a simplified schematic block diagram of a nonlinear control block.

FIG. 9 is a simplified block diagram of one specific embodiment of nonlinear control block 41. Nonlinear control block 41 includes a signal analysis device 36, and a filter control device 37. Digital data stream 39 is supplied to signal analysis device 36. Signal analysis device 36 senses the digital amplitude of data stream 39, which is proportional to the voltage amplitude of analog input signal 38. Signal analysis device 36 outputs a two-bit signal analysis code indicative of whether the digital amplitude is: in first range 55 ("00"), in second range 58 or fourth range 60 ("01"), in third range 59 or fifth range 61 ("11").

Figure 10:
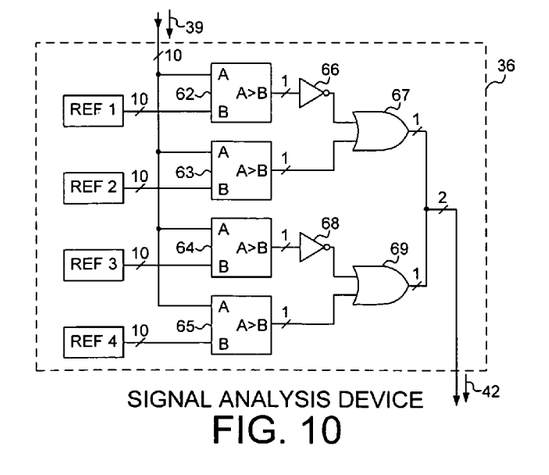
FIG. 10 is a simplified schematic block diagram of a signal analysis device.

FIG. 10 is a simplified schematic block diagram of one specific example of signal analysis device 36. Signal analysis device 36 senses the digital amplitude of ten-bit intermediary digital data stream 39 by comparing the value of the ten-bit data stream to four ten-bit reference values. The values are compared using four comparators 62–65.

Comparator 62 compares the value of ten-bit data stream 39 to a first reference value, in this embodiment a ten-bit value equaling seven. When the value of data stream 39 is greater than the digital value seven, comparator 62 outputs a one-bit digital one, which is then inverted to zero by inverter 66. Comparator 63 compares the value of data stream 39 to a second reference value, a ten-bit value equaling one thousand fifteen. When the value of data stream 39 is greater than the digital value one thousand fifteen, comparator 63 outputs a digital one. The output of converter 66 and comparator 63 are then ORed by OR gate 67. OR gate 67 outputs a one-bit digital one whenever the digital amplitude of ten-bit data stream 39 is greater than the digital value one thousand fifteen or below seven. As shown in FIGS. 7 and 8, the amplitudes of data stream 39 above the digital value one thousand fifteen and below the digital value seven correspond to voltage ranges exhibiting the greatest non-random quantization noise. As shown in FIG. 8, digital amplitudes of data stream 39 that are greater than the digital value one thousand fifteen fall within third range 59.

Returning to FIG. 10, the amplitude of data stream 39 is likewise compared by comparator 64 with a third reference value equaling fifteen, and by comparator 65 with a fourth reference value equaling one thousand seven. The output of comparator 64 is inverted by inverter 68, whose output is ORed by OR gate 69 with the output of comparator 65. OR gate 69 outputs a one-bit digital one whenever the amplitude of data stream 39 falls within either lower range 57 or upper range 59.

The one-bit outputs of OR gate 67 and OR gate 69 together constitute a two-bit signal analysis code 42, which is output by signal analysis device 36. When both bits of signal analysis code 42 are digital ones, the digital amplitude of data stream 39 falls within amplitude third ranges 59 or fifth range 61 that exhibit the greatest non-random quantization noise. When only one of the bits of signal analysis code 42 is a digital one, the digital amplitude of data stream 39 falls within second range 58 or fourth range 60. When the two-bit signal analysis code 42 is "00", the digital amplitude of data stream 39 falls within the first range 55 in which quantization noise is the smallest. As shown in FIG. 9, the two-bit signal analysis code 42 is supplied to filter control device 37 through a 2-bit bus.

Figure 11:
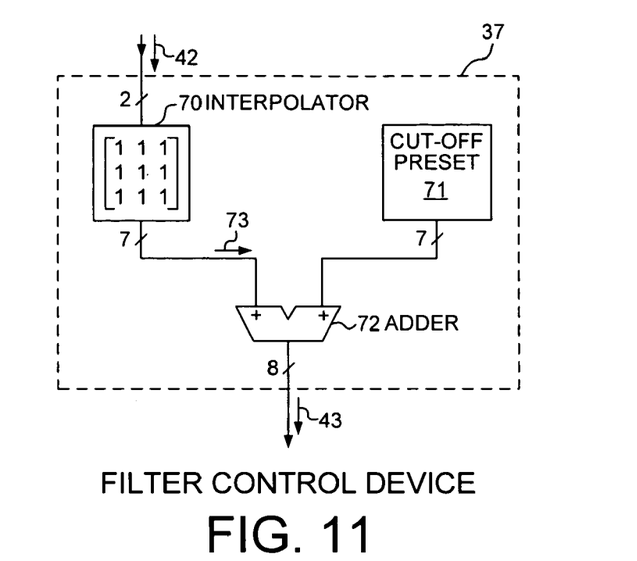
FIG. 11 is a simplified schematic block diagram of a filter control device.

FIG. 11 is a simplified schematic block diagram of one specific example of filter control device 37. Filter control device 37 includes an interpolator 70, a cut-off preset register 71 and an adder 72. Interpolator 70 adds five bits to the two-bit signal analysis code 42 and outputs the resulting seven-bit signal as an interpolated signal analysis code 73. In this embodiment, immediately following a change in the value of signal analysis code 42, the five added bits are incremented or decremented over time in a pre-defined, non-linear manner so that the rate of change of the value of seven-bit interpolated signal analysis code 73 is at first slower, then speeds up, and then slows. This interpolated change in the value of the seven-bit code 73 smoothes the change from the control value for one sensed digital amplitude to the next sensed digital amplitude.

Interpolated signal analysis code 73 is added by adder 72 to a pre-set code corresponding to the pre-set first cut-off frequency $f_C1$ of second frequency response curve 51 of variable low-pass filter 35. The pre-set code is stored in the cut-off preset register 71. The cut-off frequency of second frequency response curve 51 varies from the pre-set cut-off frequency $f_C1$ based on the value of the interpolated signal analysis code 73. Adder 72 outputs the 8-bit filter control value 43.

Figure 12:
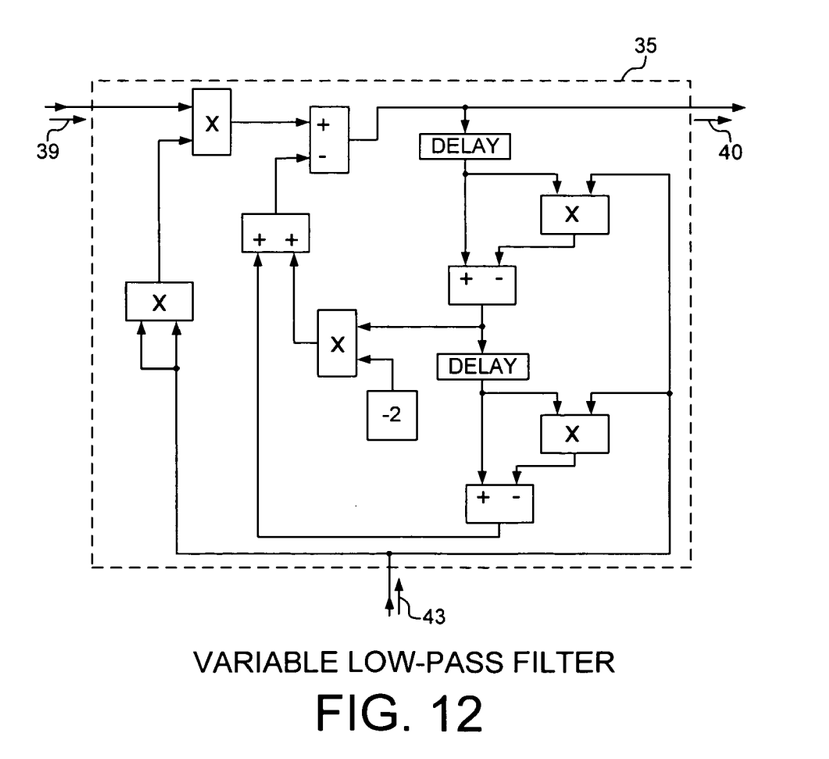
FIG. 12 is a simplified schematic block diagram of a variable low-pass filter.

FIG. 12 is a simplified schematic block diagram of variable low-pass filter 35. In this embodiment, variable low-pass filter 35 is an infinite impulse response (IIR) digital filter. In addition to receiving digital data stream 39, variable low-pass filter 35 also receives the 8-bit filter control value 43 from nonlinear control block 41. Each different filter control value 43 configures the variable low-pass filter 35 to have an associated different cut-off frequency. Filter gain, however, remains substantially constant regardless of which filter control value is being used. In this embodiment, the gain in the pass band of variable low-pass filter 35 remains near unity for all cut-off frequencies. For additional information on configurable infinite impulse response filters, such as variable low-pass filter 35 in accordance with this embodiment, see U.S. Pat. No. 6,009,445, by Anatoliy V. Tsyrganovich, issued Dec. 28, 1999 (the entirety of which is hereby incorporated by reference).

Figure 13:
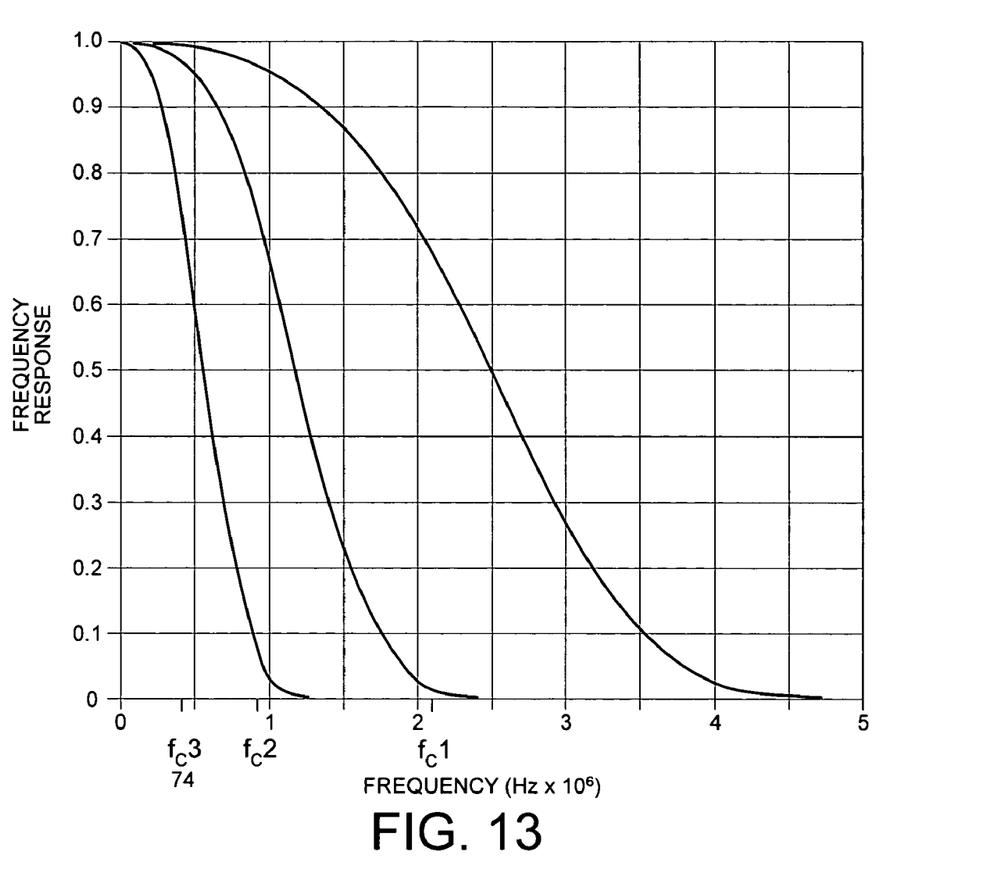
FIG. 13 is a graph of the frequency response curve of FIG. 6 in a larger scale.

FIG. 13 shows second frequency response curve 51 of variable low-pass filter 35 for three different values of filter control value 43. In one possible configuration, second frequency response curve 51 has third cut-off frequency $f_C3$ (74) when filter control value 43 corresponds to a signal analysis code 42 of two digital ones ("11"). In this configuration, the cut-off frequency of second frequency response curve 51 is lowest when the digital amplitude of data stream 39 falls within an amplitude range that exhibits the greatest non-random quantization noise, such as third range 59 or fifth range 61. When configured with third cut-off frequency $f_C3$ (74), variable low-pass filter 35 filters out significant non-random quantization noise that has passed through digital low-pass filter 31. The resulting reduction in non-random quantization noise is evident in FIG. 8 by comparing the low noise of digital output 40 to the large noise envelope of digital data stream 39.

Figure 14:
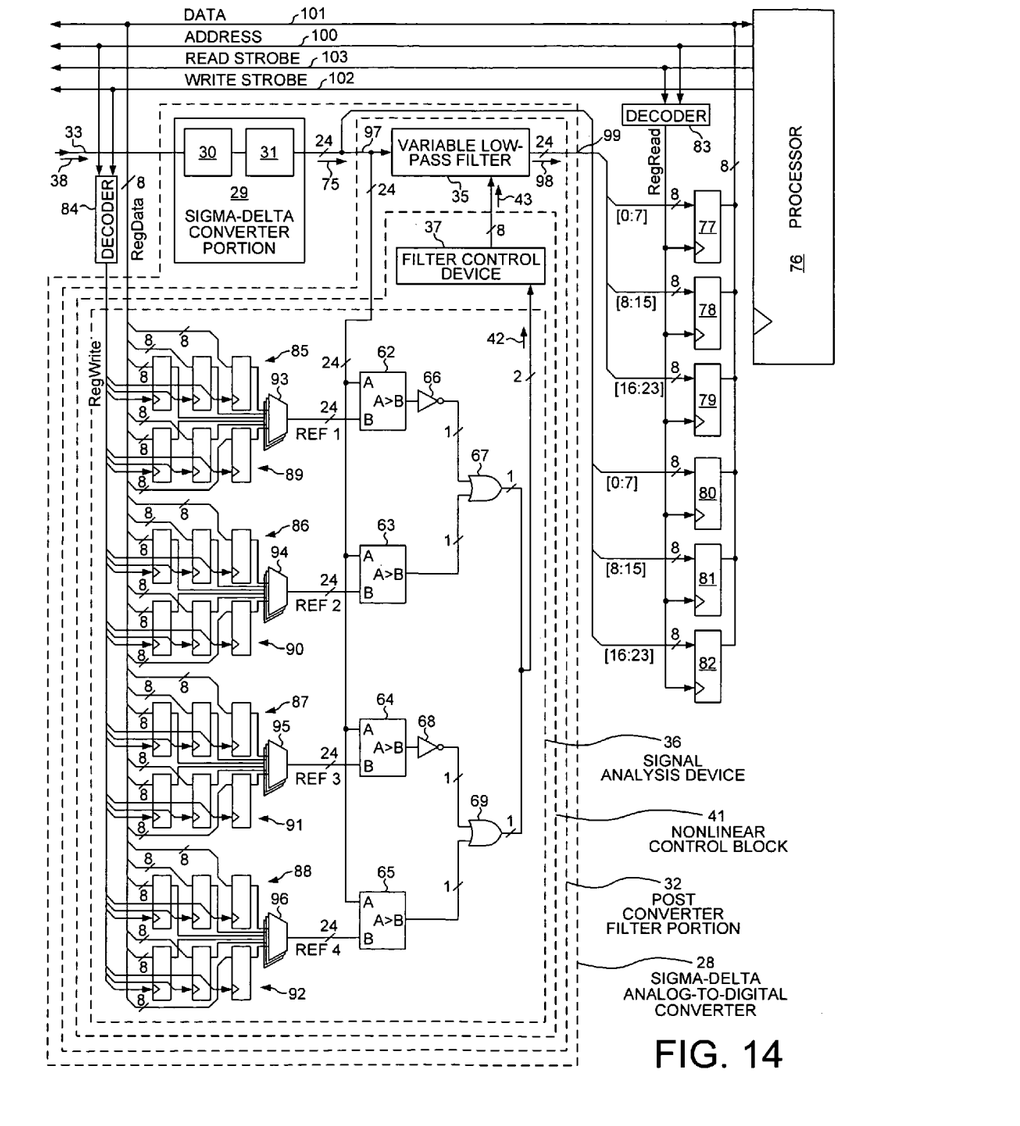
FIG. 14 is a simplified schematic block diagram of a sigma-delta converter with a variable low-pass filter and programmable bit resolution.

FIG. 14 is a simplified schematic block diagram of yet another embodiment of a sigma-delta analog-to-digital converter. Like numerals in FIGS. 3 and 14 indicate like components. The embodiment of FIG. 14 is programmable such that post converter filter portion 32 can receive a variable-width intermediary data stream 75. In this embodiment, SDADC 28, a processor 76, output registers 77–79, noise detection registers 80–82 and address decoders 83–84 are integrated onto an integrated circuit. Signal analysis device 36 includes four sets of three 8-bit amplitude reference registers 85–88, as well as four sets of three 8-bit noise reference registers 89–92. Each set of amplitude reference registers is grouped with a corresponding set of noise reference registers and twenty-four 2:1 multiplexers. Multiplexer group 93 multiplexes each bit output by amplitude reference registers 85 with a corresponding bit of noise reference registers 89. Similarly, multiplexer groups 94–96 multiplex each bit output by amplitude reference registers 86–88 with a corresponding bit of noise reference registers 90–92, respectively.

Sigma-delta converter portion 29 can be programmed through processor 76 to convert analog input signal 38 into intermediary digital data stream 75 having an N-bit resolution. Intermediary data stream 75 is N bits wide, where N is an integer from eight to twenty-four. For example, where N is twenty-four, intermediary digital data stream 75 uses all of the 16,777,216 ($2^{24}$) digital states available for the 24-bit output of digital low-pass filter 31. Post converter filter portion 32 receives intermediary data stream 75 on the first N lines of a 24-bit bus 97. SDADC 28 outputs a stream of N-bit digital output values 98 onto the first N lines of a 24-bit output bus 99. For example, where N is ten, the first eight bits [0:7] of stream of digital output values 98 are received by output register 77. The next two bits [8:9] of stream of digital output values 98 are received by output register 78.

Processor 76 can write to amplitude reference registers 85–88 and noise reference registers 89–92 and read from output registers 77–79 and noise detection registers 80–82. To write to amplitude reference registers 85–88 and noise reference registers 89–92, processor 76 outputs the address of the appropriate register onto an address bus 100 of the processor. Processor 76 outputs the data to be written into the register onto a data bus 101 and then outputs a write strobe signal onto a write strobe output line 102. Address decoder 84 generates a write strobe signal RegWrite when it detects the address of a particular register of amplitude reference registers 85–88 or noise reference registers 89–92 being present on address bus 100 at the same time that the write strobe is detected on write strobe line 102. When the write strobe signal RegWrite is supplied to a particular register of amplitude reference registers 85–88 or noise reference registers 89–92, the data on data bus 101 is clocked into the particular register.

Processor 76 reads from one of output registers 77–79 or noise detection registers 80–82 by supplying the address of the particular register onto address bus 100 and then outputting a read strobe signal onto a read strobe line 103. When decoder 83 detects the address of the particular register on address bus 100 at the same time that the read strobe signal is present on read strobe line 103, decoder 83 outputs a read strobe (RegRead). When the particular register receives the read strobe RegRead, it outputs its contents onto data bus 101. Processor 76 clocks at about twenty MHz.

SD modulator 30 samples analog input signal 38 at a frequency of about ten MHz and operates in 128 cycles, outputting a digital output of 1-bit resolution at about eighty kHz. Sigma-delta converter portion 29 is programmable to convert the 1-bit digital output of SD modulator 30 into a multi-bit input of digital low-pass filter 31. Digital low-pass filter 31 outputs intermediary digital data stream 75 containing quantization noise introduced by SD modulator 30, as well as other noise.

Where sigma-delta converter portion 29 is programmed to increase the bit width of intermediary digital data stream 75, and thus to increase bit resolution, the speed of SDADC 28 decreases. Speed decreases because multiple-bit intermediary digital data stream 75 is ultimately generated from the 1-bit digital output of SD modulator 30.

The speed of post converter filter portion 32 is also inversely related to bit resolution. For example, variable low-pass filter 35 can operate with a bandwidth of about 10 kHz when receiving a 10-bit intermediary digital data stream 75, whereas the bandwidth of variable low-pass filter 35 decreases to about 100 Hz for a 16-bit intermediary digital data stream 75. Thus, the same SD modulator 30 of the embodiment of SDADC 28 shown in FIG. 14 can be used for multiple applications that each requires a different bit resolution. For example, SDADC 28 can be used for low-speed, high-resolution applications, as well as high-speed, low-resolution applications. Examples of low-speed, high-resolution applications include the detection of infrequently changing values, such as ambient temperature or the expansion of a span of a bridge. An example of a high-speed, low-resolution application is the determination of the precise time at which an event takes place, such as the time at which ignition occurs in an engine cylinder.

A user can program the embodiment of FIG. 14 to filter out quantization noise that is most prevalent in the upper and most ranges of digital amplitude of intermediary digital data stream 75. Where intermediary digital data stream 75 is ten bits wide, signal analysis device 36 compares the digital amplitude of various data points of intermediary digital data stream 75 to the four boundaries between five amplitude ranges. FIG. 7 illustrates the four boundaries between fifth range 61, fourth range 60, first range 55, second range 58 and third range 59, which are defined by the 10-bit reference values seven, fifteen, one thousand seven, and one thousand fifteen, respectively. The four 10-bit reference values are stored in the four sets of amplitude reference registers 85–88. For example, the first reference value, the ten-bit value equaling seven, is stored in two of the three 8-bit amplitude reference registers 85.

Where intermediary digital data stream 75 is twenty-four bits wide, signal analysis device 36 compares the digital amplitude of various data points of intermediary digital data stream 75 to four different boundaries between five new amplitude ranges. The amplitude ranges wherein non-random quantization noise is most prevalent in intermediary digital data stream 75 can be empirically determined through testing. In one example, the boundaries of the five noise ranges of 24-bit intermediary digital data stream 75 are defined by the four 24-bit reference values equaling 131,071, 262,143, 16,515,071 and 16,646,143. In the process of programming SDADC 28 to operate in a 24-bit mode, processor 76 writes these four 24-bit reference values into the four sets of amplitude reference registers 85–88. For example, the fourth reference value, the 24-bit value equaling 16,646,143, is stored in the three 8-bit amplitude reference registers 88.

After signal analysis device 36 compares the digital amplitude of a data point of intermediary digital data stream 75 to the four boundaries between five amplitude ranges, signal analysis device 36 supplies two-bit signal analysis code 42 to filter control device 37. Signal analysis code 42 indicates the digital amplitude range of the data point, and therefore the likely amount of quantization noise. The embodiment of SDADC 28 in FIG. 14 then lowers the cut-off frequency of variable low-pass filter 35 in the manner described for the previous embodiments when a data point of intermediary digital data stream 75 has a digital amplitude in a range of high quantization noise.

Intermediary digital data stream 75 may contain noise other than quantization noise. In addition to determining the level of quantization noise by sensing digital amplitude, the embodiment of FIG. 14 also senses the general noise level by calculating the average deviation of a predetermined number of data point of intermediary digital data stream 75. When SDADC 28, processor 76 and the other circuitry of the embodiment of FIG. 14 sense a high general noise level, multiplexer groups 93–96 of signal analysis device 36 select an alternative set of reference values that expand the amplitude ranges for which the cut-off frequency of variable low-pass filter 35 is lowered.

Successive data points of intermediary digital data stream 75 are periodically written into noise detection registers 80–82. For example, sixteen points of data are written starting every $1024^{th}$ data point. Processor 76 then reads the data points of intermediary digital data stream 75 and calculates the average deviation of the sixteen data points to the average value of the sixteen points. When the calculated average deviation exceeds a predetermined value, processor 76 outputs a high-noise select signal. The high-noise select signal causes each multiplexer of multiplexer groups 93–96 to select a bit from noise reference registers 89–92. In one example, the boundaries of the five noise ranges for a high level of noise of 24-bit intermediary digital data stream 75 are defined by the four alternative reference values: 262,143, 524,287, 16,252,927 and 16,515,071.

In yet another embodiment of a sigma-delta analog-to-digital converter, filter control device 37 receives a high-noise select signal from processor 76. This embodiment does not contain the four sets of three noise reference registers 89–92, and none of the amplitude ranges is expanded when a high noise level is detected. When the calculated average deviation of a predetermined number of data points of intermediary digital data stream 75 exceeds a predetermined value, the high-noise select signal causes filter control device 37 to lower the cut-off frequency of variable low-pass filter 35 by an additional predetermined amount for each range of digital amplitude.

Although the present invention has been described in connection with certain specific embodiments for instructional purposes, the present invention is not limited thereto. Modulators having different noise shaping characteristics can be used. In some cases, noise is shaped both to higher and lower frequencies that the frequency band of interest. In such cases, both the filter of the sigma-delta converter portion, as well as the filter of the post converter filter portion are band-pass filters. In one specific embodiment, for example, second frequency response curve 51 resembles the transfer function of a band-pass filter rather than a low-pass filter. In that embodiment, variable low-pass filter 35 is replaced with a variable band-pass filter. The lower tail portions of the band-pass filter realized by the variable band-pass filter are used to filter out non-random quantization noise that has a frequency lower than the frequency band 46 of analog input signal 38.

In yet another embodiment, variable low-pass filter 35 is a finite impulse response (FIR) digital filter rather than an infinite impulse response (IIR) digital filter. In yet another embodiment, digital low-pass filter 31 includes a decimation circuit that reduces the data rate of digitized input signal 38, which is output by sigma-delta modulator 30. Although the amplitude of the digital data stream is described as representing the voltage of an input signal, the amplitude in other embodiments can represent the current of an input current signal. The post converter filter portion can be controlled to vary filter attributes other than the cutoff frequency. For example, the post converter filter portion can be controlled to change the attenuation in the stop band of the filter. In yet another embodiment, variable low-pass filter 35 is switched off when the amplitude of the digital data stream is in the first range of smaller amplitude corresponding to a smaller quantization noise.

Accordingly, various modifications, adaptations, and combinations of various features of the described embodiments can be practiced without departing from the scope of the invention as set forth in the claims.

What is claimed is:
1. A circuit comprising:
a sigma-delta converter portion that outputs a digital data stream with a digital amplitude, the digital data stream being N bits wide in a first mode and M bits wide in a second mode; and a post converter filter portion that receives the digital data stream, the post converter filter portion having a cut-off frequency that is determined at least in part based on the digital amplitude of the digital data stream.

2. The circuit of claim 1, wherein the digital data stream is a series of multi-bit digital values, each multi-bit digital value having N bits in the first mode and M bits in the second mode, wherein the series of multi-bit digital values has $2^N$ different digital values in the first mode and $2^M$ different digital values in the second mode, and wherein the digital amplitude at a given point in time is one of the multi-bit digital values.

3. The circuit of claim 1, wherein in the first mode, the post converter filter portion has a first cut-off frequency when the digital amplitude of the digital data stream is in a first amplitude range, and the post converter filter portion has a second cut-off frequency when the digital amplitude of the digital data stream is in a second amplitude range.

4. The circuit of claim 3, further comprising:
a register that stores a reference value corresponding to the digital amplitude at a boundary between the first amplitude range and the second amplitude range.

5. The circuit of claim 4, further comprising:
a processor, wherein the register is writable by the processor.

6. The circuit of claim 3, wherein the sigma-delta converter portion has a digital low-pass filter having a fixed cut-off frequency, wherein the first cut-off frequency of the post converter filter portion is higher than the fixed cut-off frequency, and wherein the second cut-off frequency of the post converter filter portion is lower than the fixed cut-off frequency.

7. The circuit of claim 1, wherein the sigma-delta converter portion comprises a sigma-delta modulator and a digital low-pass filter.

8. The circuit of claim 1, wherein post converter filter portion comprises a variable low-pass filter, and wherein the variable low-pass filter is an infinite impulse response digital filter.

9. The circuit of claim 1, wherein the circuit is an integrated circuit.

10. The circuit of claim 1, wherein the post converter filter portion includes a variable low-pass filter, the variable low-pass filter being controlled by a digital filter control value, the digital filter control value being determined at least in part based on the digital amplitude of the digital data stream.

11. The circuit of claim 1, wherein the digital data stream has a noise level, and wherein the cut-off frequency of the post converter filter portion is determined at least in part based on the noise level of the digital data stream.

12. The circuit of claim 11, wherein the noise level of the digital data stream is calculated based on an average deviation of a predetermined number of the multi-bit digital values of the digital data stream.

13. The circuit of claim 1, wherein M is larger than N, and wherein the cut-off frequency in the first mode when the digital amplitude equals A is the same as the cut-off frequency in the second mode when the digital amplitude has a value that is greater than A.

14. A method, comprising:
receiving a digital data stream from a sigma-delta converter portion, the digital data stream having a digital amplitude and containing noise;
setting a cut-off frequency of a variable filter of a post converter filter portion based at least in part on the digital amplitude of the digital data stream; and
passing the digital data stream through the variable filter such that the post converter filter portion filters out a portion of the noise.

15. The method of claim 14, wherein the digital data stream is N bits wide in a first mode and M bits wide in a second mode, and wherein the cut-off frequency in the first mode when the digital amplitude equals A is the same as the cut-off frequency in the second mode when the digital amplitude equals A times M divided by N.

16. The method of claim 15, further comprising:
programming a value for N and a value for M.

17. The method of claim 14, wherein the setting the cut-off frequency comprises:
writing a reference value to a register, wherein the reference value corresponds to a boundary of an amplitude range.

18. The method of claim 14, wherein the setting the cut-off frequency comprises:
determining the digital amplitude of the digital data stream; and
comparing the digital amplitude to a boundary of an amplitude range.

19. The method of claim 14, wherein the digital data stream has a noise level, and wherein the setting the cut-off frequency is based at least in part on the noise level of the digital data stream.

20. A sigma-delta analog-to-digital converter, comprising:
a sigma-delta converter portion that outputs an intermediary digital data stream of multi-bit digital values, each of the multi-bit digital values having N bits, the intermediary digital data stream having noise; and
means for receiving the intermediary digital data stream and for outputting a digital data stream of multi-bit digital values such that the digital data stream has less noise than the intermediary digital data stream, wherein each of the multi-bit digital values of the digital data stream has N bits, and wherein the means is programmable to receive the intermediary digital data stream in a first mode for which N is a first value and in a second mode for which N is a second value.

21. The sigma-delta analog-to-digital converter of claim 20, wherein each of the intermediary digital data stream and the digital data stream has $2^N$ possible digital values.

22. The sigma-delta analog-to-digital converter of claim 20, wherein the means comprises:
means for analyzing a digital amplitude of the intermediary digital data stream and for outputting a filter control value; and
a variable filter that receives the filter control value from the means for analyzing.

23. The sigma-delta analog-to-digital converter of claim 20, wherein the means filters the intermediary digital data stream with a variable filter.

* * * * *

UNITED STATES PATENT AND TRADEMARK OFFICE
CERTIFICATE OF CORRECTION

| | | |
|---|---|---|
| PATENT NO. | : 7,068,197 B1 | Page 1 of 1 |
| APPLICATION NO. | : 10/821517 | |
| DATED | : June 27, 2006 | |
| INVENTOR(S) | : Tsyrganovich | |

It is certified that error appears in the above-identified patent and that said Letters Patent is hereby corrected as shown below:

Column 12, line 67, the following text should be added after the words "in a second mode" and before the semicolon --, wherein the sigma-delta converter portion includes a sigma-delta modulator and a filter--

Thus, lines 63-68 of column 12 should read:

1. A circuit comprising:
a sigma-delta converter portion that outputs a digital data stream with a digital amplitude, the digital data stream being N bits wide in a first mode and M bits wide in a second mode, wherein the sigma-delta converter portion includes a sigma-delta modulator and a filter; and Signed and Sealed this Twenty-ninth Day of August, 2006

JON W. DUDAS
*Director of the United States Patent and Trademark Office*